(12) United States Patent
Kim et al.

(10) Patent No.: US 11,032,505 B2
(45) Date of Patent: Jun. 8, 2021

(54) RAMP SIGNAL GENERATOR AND CMOS IMAGE SENSOR USING THE SAME

(71) Applicant: SK hynix Inc., Gyeonggi-do (KR)

(72) Inventors: Hyeon-June Kim, Jeollanam-do (KR); Hoe-Sam Jeong, Seoul (KR)

(73) Assignee: SK hynix Inc., Icheon-si (KR)

( * ) Notice: Subject to any disclaimer, the term of this patent is extended or adjusted under 35 U.S.C. 154(b) by 16 days.

(21) Appl. No.: 16/219,826

(22) Filed: Dec. 13, 2018

(65) Prior Publication Data

US 2019/0327438 A1    Oct. 24, 2019

(51) Int. Cl.
| | |
|---|---|
| *H04N 5/3745* | (2011.01) |
| *H04N 5/378* | (2011.01) |
| *H04N 9/04* | (2006.01) |
| *H04N 5/376* | (2011.01) |
| *H01L 27/146* | (2006.01) |

(52) U.S. Cl.
CPC ... *H04N 5/37455* (2013.01); *H01L 27/14645* (2013.01); *H04N 5/378* (2013.01); *H04N 5/3765* (2013.01); *H04N 9/045* (2013.01)

(58) Field of Classification Search
CPC .. H04N 5/37455; H04N 5/378; H04N 5/3765; H04N 9/045; H01L 27/14645
See application file for complete search history.

(56) References Cited

U.S. PATENT DOCUMENTS

| | | | | |
|---|---|---|---|---|
| 2008/0170137 A1* | 7/2008 | Matsumoto | .......... | H04N 5/3575 348/241 |
| 2009/0174442 A1* | 7/2009 | Kim | .............. | H04N 5/378 327/134 |
| 2010/0134083 A1* | 6/2010 | Trescases | .............. | G04F 10/005 323/283 |
| 2012/0194367 A1* | 8/2012 | Wang | .............. | H04N 5/378 341/120 |
| 2015/0172580 A1* | 6/2015 | Zhang | .............. | H03M 1/18 250/208.1 |
| 2016/0315602 A1 | 10/2016 | Sohn | | |
| 2017/0127001 A1* | 5/2017 | Song | .............. | H04N 5/378 |
| 2020/0036924 A1* | 1/2020 | Kim | .............. | H04N 5/378 |

FOREIGN PATENT DOCUMENTS

| | | |
|---|---|---|
| CN | 101227551 A | 7/2008 |
| CN | 103002228 A | 3/2013 |
| CN | 107070178 A | 8/2017 |
| KR | 10-2008-0034687 A | 4/2008 |
| KR | 10-2012-0002274 A | 9/2012 |
| KR | 10-2019-0097704 | 8/2019 |

OTHER PUBLICATIONS

Office Action dated Apr. 6, 2021 in Chinese Patent Application No. 201811465228.2, 21 pages.

* cited by examiner

*Primary Examiner* — Lin Ye
*Assistant Examiner* — John H Morehead, III
(74) *Attorney, Agent, or Firm* — Perkins Coie LLP

(57) ABSTRACT

Provided are devices having a device including a ramp signal generator which may comprise: a slope control circuit configured to generate a controllable analog reference voltage according to a digital setting code value to control a slope of a ramp signal; and at least one unit current cell configured to adjust the slope of the ramp signal by adjusting a current flowing through the at least one unit current cell according to the controllable analog reference voltage generated by the slope control circuit.

17 Claims, 11 Drawing Sheets

RAMP SIGNAL GENERATOR AND CMOS IMAGE SENSOR USING THE SAME

CROSS-REFERENCE TO RELATED APPLICATIONS

The patent document claims the priority and benefits of Korean Patent Application No. 10-2018-0047291, filed on Apr. 24, 2018, which is incorporated herein by reference in its entirety.

TECHNICAL FIELD

The technology and implementations disclosed in this patent document relate to an analog-to-digital conversion device and a complementary metal oxide semiconductor (CMOS) image sensor (CIS).

BACKGROUND

In general, an image sensing device includes pixels for capturing images using photodiodes (PD) that converts light into an electrical current and transfer it to a floating diffusion node, which is an input node (a gate terminal) of a conversion transistor (a source follower transistor), through a transfer transistor. The electric current transferred to the floating diffusion node may shift the voltage at an output terminal of the conversion transistor, and this output voltage is called a pixel signal.

For purposes of quality control of the image sensing device, exposure linearity tests are conducted to check linearity of an analog-to-digital conversion code while increasing the amount of light incident on the photodiode of the pixel.

The non-linearity occurs in the process of transferring the electrical current generated by the photodiode to the floating diffusion node.

Additionally, since a slope of a ramp signal (a ramp voltage) has linearity, a code error occurs in the process of finding a position of a pixel signal based on the ramp signal.

An acceptable error rate for a code error is typically around 1%, but those non-linearity issues may cause the code error range to exceed the acceptable error rate.

Where the non-linearity of the pixel signal is increased as the amplitude of the pixel signal is increased like a gain error, the code error range could exceed the acceptable error rate when the pixel signal has a high amplitude.

SUMMARY

This patent document provides, among others, designs of image sensing devices that have a ramp signal generator for adjusting a slope of a ramp signal by adjusting a current of a unit current cell to adjust a step size, unlike another ramp signal generator in which a step size of a unit current cell is fixed. This patent document also provides designs of image sensing devices that have a ramp signal generator that minimizes a code error by nonlinearly adjusting a slope of a ramp signal similarly to nonlinearity of a pixel signal.

In an embodiment of the disclosed technology, a device including a ramp signal generator which may comprise: a slope control circuit configured to generate a controllable analog reference voltage according to a digital setting code value to control a slope of a ramp signal; and at least one unit current cell configured to adjust the slope of the ramp signal by adjusting a current flowing through the at least one unit current cell according to the controllable analog reference voltage generated by the slope control circuit.

The slope control circuit may comprise: a code providing circuit configured to provide the digital setting code value; and a controllable reference voltage generation circuit configured to generate the controllable analog reference voltage according to the digital setting code value provided by the code providing circuit. The code providing circuit may further comprise: a buffer configured to apply to the at least one unit current cell the controllable analog reference voltage generated by the controllable reference voltage generation circuit. The buffer may include a source follower circuit. The code providing circuit may comprise: a memory configured to receive the digital setting code value from an external image signal processor (ISP), store the digital setting code value, and provide the digital setting code value to the controllable reference voltage generation circuit. The controllable reference voltage generation circuit may include a digital-to-analog converter (DAC). A level of an ON/OFF voltage of the at least one unit current cell may be adjusted according to the controllable analog reference voltage generated by the slope control circuit. The ramp signal generator may adjust the slope of the ramp signal by adjusting a current flowing through the at least one unit current cell.

In another embodiment of the disclosed technology, a device including a CMOS image sensor which may comprise: a pixel array configured to include an array of photosensing pixels in rows and columns to output a pixel signal corresponding to incident light; a row decoder configured to select and control pixels in the pixel array according to row lines coupled to rows of photosensing pixels; a ramp signal generator configured to adjust a slope of a ramp signal by adjusting a channel current flowing through an analog switch device based on an analog voltage that may be adjustable in response to a digital code; a comparison circuit configured to compare the ramp signal applied from the ramp signal generator with each pixel signal of the pixel array; a counting circuit configured to count a number of clock pulses according to each output signal of the comparison circuit; a memory circuit configured to store counting information of the counting circuit including the number of clock pulses provided by the counting unit; a control circuit configured to control operations of the row decoder, the ramp signal generator, the comparison circuit, the counting circuit, and the memory circuit; and a column readout circuit configured to output data stored in the memory circuit according to instructions provided by the control circuit.

The ramp signal generator may comprise: a slope control circuit configured to generate a controllable analog reference voltage according to a digital setting code value to adjust the slope of the ramp signal; and at least one unit current cell configured to adjust the slope of the ramp signal according to the controllable analog reference voltage generated by the slope control circuit. The slope control circuit may comprise: a code providing circuit configured to provide the digital setting code value; and a controllable reference voltage generation circuit configured to generate the controllable analog reference voltage according to the digital setting code value provided by the code providing circuit. The code providing circuit may further comprise: a buffer configured to apply to the at least one unit current cell the controllable reference voltage of the controllable reference voltage generation circuit. The buffer include a source follower circuit. The code providing circuit may comprise: a memory configured to receive the digital setting code value from an external image signal processor (ISP), store the digital setting code value, and provide the digital setting code value to the controllable reference voltage generation circuit. The controllable reference voltage generation circuit may include a digital-to-analog converter (DAC). A level of an ON/OFF voltage of the at least one unit current cell may be adjusted according to the controllable analog reference voltage generated by the slope control circuit. The ramp signal generator may adjust the slope of the ramp signal by adjusting a current flowing through the at least one unit current cell.

In another embodiment of the disclosed technology, a device including a ramp signal generator which may comprise: a unit current cell including a current path that allows an electrical current constituting a ramp signal to flow from a ramp supply voltage terminal to a ramp resistor, the current path including an analog switch device coupled between the ramp supply voltage terminal and the ramp resistor; and a slope control circuit coupled to the analog switch device and configured to receive a digital setting code value and generate a controllable analog reference voltage in response to the digital setting code value to apply the controllable analog reference voltage to the analog switch device to control a slope of a ramp signal.

The unit current cell may adjust the slope of the ramp signal by adjusting a channel current flowing through the analog switch device based on the controllable analog reference voltage, which may be adjustable in response to the digital setting code value. The slope control circuit may include a digital-to-analog converter (DAC) that converts the digital setting code value to the controllable analog reference voltage.

In an embodiment of the disclosed technology, a ramp signal generator may include a slope control block that generates a controllable reference voltage according to a setting code value and control a slope of a ramp signal, and at least one unit current cell that adjusts the slope of the ramp signal according to the controllable reference voltage of the slope control block.

In another embodiment of the disclosed technology, a CMOS image sensor may include a pixel array that outputs a pixel signal corresponding to incident light, a row decoder that selects and controls pixels in the pixel array according to row lines, a ramp signal generator that generates a controllable reference voltage according to a setting code value, adjusts a slope of a ramp signal according to the generated controllable reference voltage, and generates the ramp signal, a comparison unit that compares the ramp signal applied from the ramp signal generator and each pixel signal of the pixel array with each other, a counting unit that counts a clock according to each output signal of the comparison unit, a memory unit that stores counting information of the counting unit, a control unit that controls operations of the row decoder, the ramp signal generator, the comparison unit, the counting unit, and the memory unit, and a column readout circuit that outputs data of the memory unit under control of the control unit.

In another embodiment of the disclosed technology, unlike another existing ramp signal generator in which a step size of a unit current cell is fixed, a current of a unit current cell is adjusted to adjust a step size, so that it is possible to adjust a slope of a ramp signal.

Furthermore, in various embodiments of the disclosed technology, the slope of the ramp signal is nonlinearly adjusted similarly to non-linearity of a pixel signal, so that it is possible to minimize a code error.

DETAILED DESCRIPTION

Figure 1:
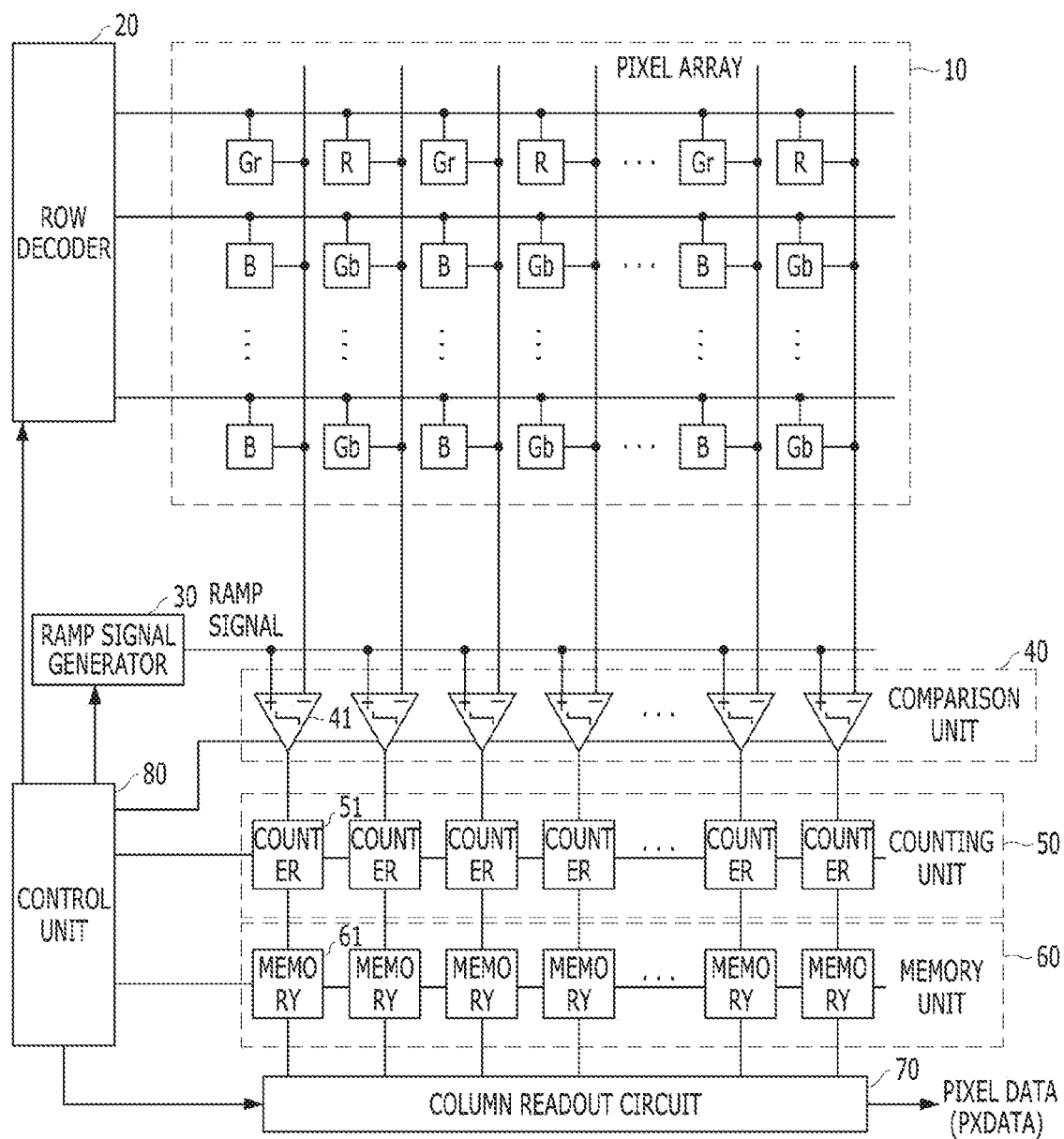
FIG. 1 is an example diagram of a CMOS image sensor for facilitating the understanding of the disclosed technology.

FIG. 1 is an example diagram of a CMOS image sensor (CIS) for facilitating the understanding of the disclosed technology, and illustrates a CMOS image sensor having a column parallel structure implemented using a general single slope analog-to-digital converter.

As illustrated in FIG. 1, the CMOS image sensor includes a pixel array 10 of photosensing pixels arranged in rows and columns to respond to incident light to output a pixel signal. Each photosensing pixel may be implemented by a photo diode, a photo transistor, a photo gate, or other photosensitive circuitry capable of converting light into a pixel signal (e.g., a charge, a voltage or a current). On top of the photosensing pixels, an array of different color filters are placed to cover the photosensing pixels to filter the incident light in different colors at different pixel locations to capture the color information in a sensed image. The specific example in FIG. 1 shows a pixel arrangement of colored imaging pixels labeled as "R" for a red colored pixel, "G" for a green colored pixel, and "B" for a blue colored pixel. The CMOS image sensor also includes a row decoder 20, a ramp signal generator 30, a comparison unit (comparison circuit) 40, a counting unit (counting circuit) 50, a memory unit (memory circuit) 60, a control unit (control circuit) 80, and a column readout circuit 70. The row decoder 20 selects pixels in the pixel array 10 according to row lines and controls operations of the pixels according to instructions provided by the control unit 80. The ramp signal generator 30 generates a ramp signal according to instructions provided by the control unit 80. The comparison unit 40 compares a value of the ramp signal applied from the ramp signal generator 30 with values of each pixel signal outputted from the pixel array 10 according to instructions provided by the control unit 80. The counting unit 50 counts the number of clock pulses of the control unit 80 according to each output signal of the comparison unit 40. The memory unit 60 stores counting information including the number of clock pulses provided by the counting unit 50 under the control of the control unit 80. The control unit 80 controls the operations of the row decoder 20, the ramp signal generator 30, the comparison unit 40, the counting unit 50, the memory unit 60, and the column readout circuit 70. The column readout circuit 70 sequentially outputs data of the memory unit 60 as pixel data PXDATA according to instructions provided by the control unit 80.

A CMOS image sensor may use the correlated double sampling (CDS) to remove an offset value of pixels by sampling a pixel signal twice so that the difference is taken between these two samples. In an embodiment of the disclosed technology, the correlated double sampling (CDS) may remove an offset value of pixels by comparing pixel signals (pixel output voltages) obtained before and after light is incident on the pixels with each other, so that only pixel signals based on the incident light can be actually measured. In an embodiment of the disclosed technology, the CDS may be conducted by the comparison unit 40.

The comparison unit 40 includes a plurality of comparators, the counting unit 50 includes a plurality of counters, and the memory unit 60 includes a plurality of memories. In an example configuration, each column of the pixel array 10 includes, the comparators, the counters, and the memories.

Next, with reference to FIG. 1, operations of one comparator, one counter, and one memory will be described below as an example.

A first comparator 41 has two input terminals including one terminal that receives a pixel signal outputted from a first column of the pixel array 10, and the other terminal that receives a ramp signal applied from the ramp signal generator 30. The first comparator 41 compares values of the two signals (pixel signal and ramp signal) with each other according to a control signal of the control unit 80, and outputs a comparison signal.

Examples of the ramp signal $V_{RAMP}$ include a signal whose voltage level decreases or increases, a saw-tooth signal, and other types of reference signals. When the voltage of the ramp signal matches that of the pixel signal at a certain time point, values of comparison signals outputted from each comparator are inverted.

Accordingly, a first comparator 51 counts clock pulses provided by the control unit 80 until the comparison signal outputted from the comparator 41 is inverted from the time point at which the ramp signal starts to fall, and outputs counting information regarding the number of clock pulses counted by the first comparator 51. The respective counters are initialized according to a reset control signal from the control unit 80.

Then, a first memory 61 stores the counting information regarding the number of clock pulses counted by the first comparator 51 according to a load control signal of the control unit 80, and outputs the counting information to the column readout circuit 70.

In an example of the CMOS image sensor, counting is performed on a reset signal (a reset voltage) and then is performed on an image signal (a signal voltage).

Figure 2A:
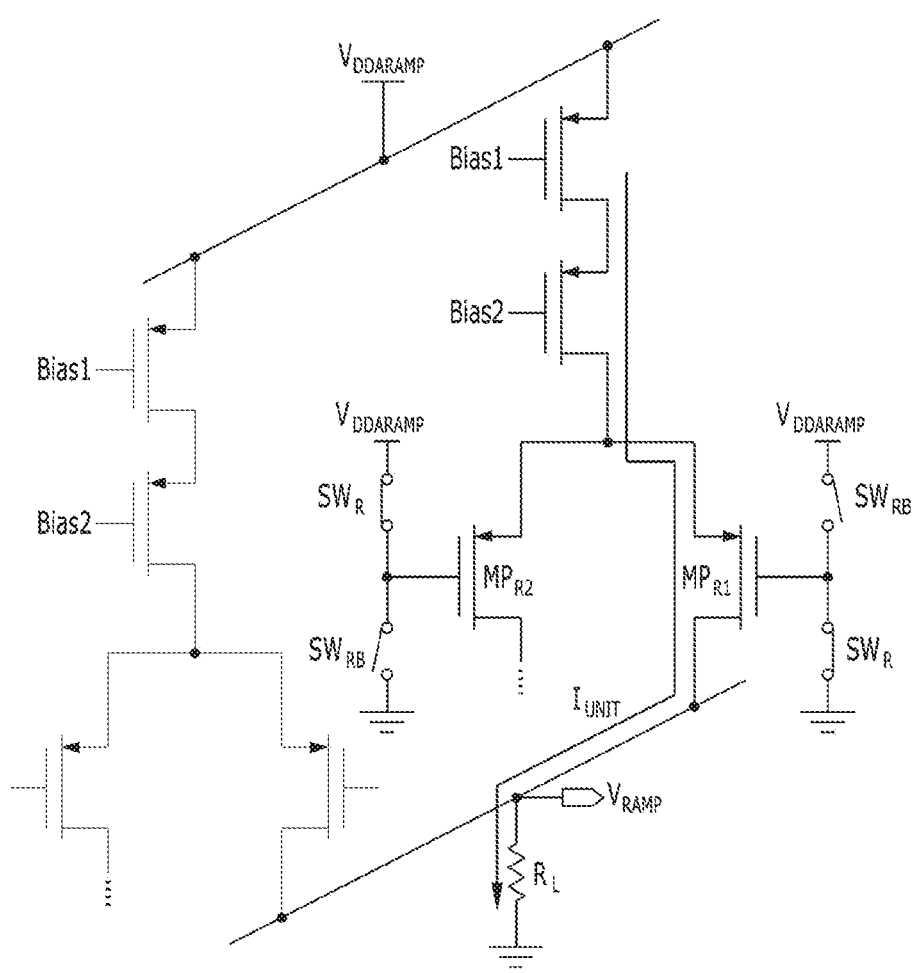
FIG. 2A and FIG. 2B are example diagrams of a ramp signal generator for facilitating the understanding of the disclosed technology.
Figure 2B:
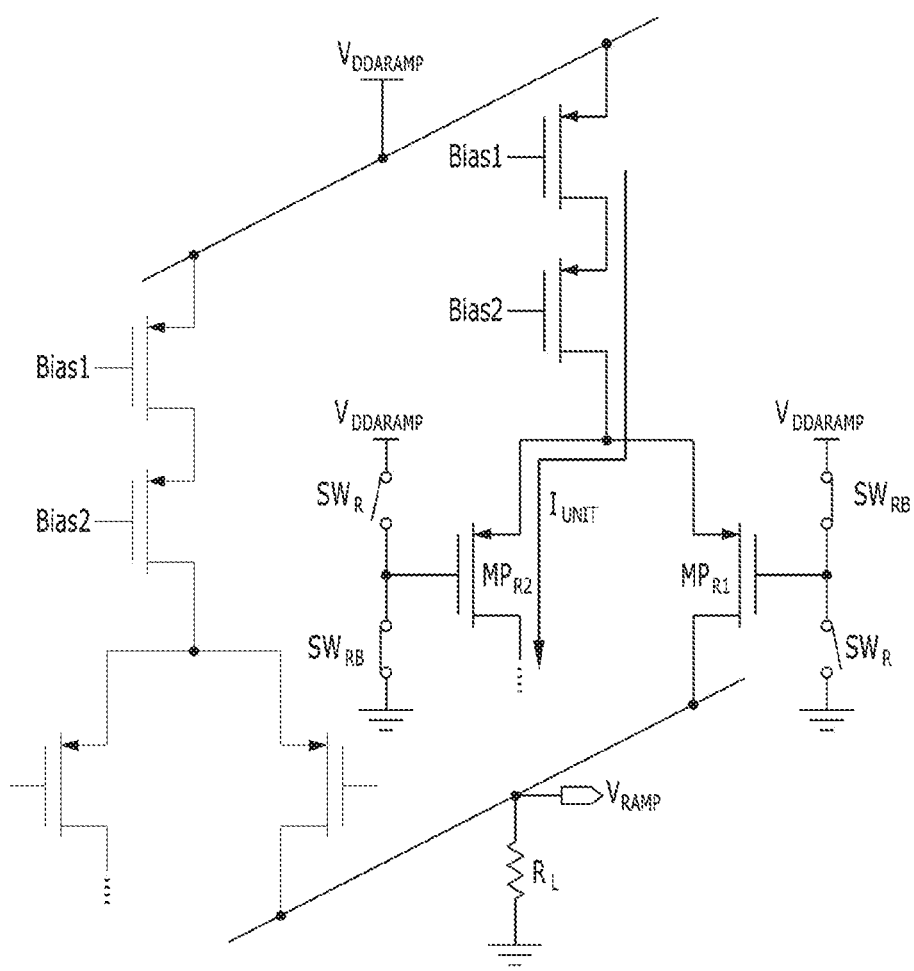

FIG. 2A and FIG. 2B are example diagrams of a ramp signal generator for facilitating the understanding of the disclosed technology.

As illustrated in FIG. 2A and FIG. 2B, the ramp signal generator includes a unit current cell array and a ramp resistor $R_L$, which is a common node electrically connected to the unit current cell array in common. Here, since a technology for supplying a ramp supply voltage $V_{DDARAMP}$, a bias voltage and the like are well-known, a description thereof will be omitted. By sequentially turning on or off the unit current cells, a ramp voltage $V_{RAMP}$ is generated according to Equation 1 below.

$$V_{RAMP}=I_{TOTAL}*R_L \qquad \text{(Equation 1)}$$

In Equation 1 above, "$I_{TOTAL}$" denotes the total electric current flowing in all the unit current cells.

For example, in a setting where a ramp signal is generated such that the amplitude of the ramp signal has a negative slope by sequentially reducing the number of the unit current cells that allow the current to flow from a voltage supply terminal of a ramp supply voltage VDDARAMP to a ramp resistor RL, an initial state of a ramp voltage is that a PMOS transistor $MP_{R2}$ stays "off" (e.g., a switch $SW_{RB}$ stays off and a switch $SW_R$ stays on) so that currents can flow through all unit current cells (i.e., through all PMOS transistors MPR1) to the ramp resistor $R_L$ as illustrated in FIG. 2A. The switch $SW_{RB}$ and the switch $SW_R$ may be provided between the ramp supply voltage terminal and a ground voltage terminal to be turned on or off in response to control signals provided by the control unit 80 of FIG. 1 or control signals provided by another controller (not illustrated) operating by receiving clock signals from the control unit 80 of FIG. 1. The switch $SW_{RB}$ and the switch $SW_R$ may be configured to control gate voltages of the PMOS transistor $MP_{R1}$ and the PMOS transistor $MP_{R2}$. As illustrated in FIG. 2B, after the initial state above the unit current cells start to change their current paths from the PMOS transistor MPR1 to the PMOS transistor MPR2. From the first unit current cell to the last current cell, the PMOS transistor $MP_{R1}$ is turned off and the PMOS transistor $MP_{R2}$ is turned on (the switch $SW_{RB}$ is turned on and the switch $SW_R$ is turned off), and the unit current cells sequentially (one by one) allow the current to flow to the PMOS transistor $MP_{R2}$ instead of the PMOS transistor MPR1. Here, the ramp voltage can be expressed by Equation 2 below.

$$V_{RAMP}=(I_{TOTAL}-I_{T\_off})*R_L \qquad \text{(Equation 2)}$$

In Equation 2 above, "$I_{T\_off}$" denotes the amount of the current reduced from the total sum $I_{TOTAL}$ of current by changing the current paths of the unit current cells from the PMOS transistor $M_{PR1}$ to the PMOS transistor $M_{PR2}$ such that the switch $SW_{RB}$ of the unit current cell is switched from "off" to "on" and the switch $SW_R$ of the unit current cell is switched from "on" to "off" as illustrated in FIG. 2A and FIG. 2B.

In another example, unlike the example shown in FIG. 2A and FIG. 2B, when the ramp signal has a positive slope, an initial state of a ramp voltage is that the PMOS transistor $MP_{R2}$ stays "on" so that the current of all the unit current cells can initially flow through the PMOS transistor $M_{PR2}$. After the initial state, the unit current cells start to change their current paths from the PMOS transistor $MP_{R2}$ to the PMOS transistor $MP_{R1}$. From the first unit current cell to the last current cell, the PMOS transistor $MP_{R1}$ is turned on, and the PMOS transistor $MP_{R2}$ is turned off, so that the unit current cells sequentially (one by one) allow the current to flow to the PMOS transistor $MP_{R1}$ instead of the PMOS transistor $MP_{R2}$.

However, in the ramp signal generator illustrated in FIG. 2A and FIG. 2B, the linearity of the slope of the ramp signal may result in the occurrence of a code error when the code error rate exceeds the acceptable error rate (e.g., 1%) in the process of finding the position of a pixel signal with the ramp signal.

Unlike the ramp signal generator of FIG. 2A and FIG. 2B in which the step size of the unit current cell is fixed, an embodiment of the disclosed technology makes it possible to adjust a step size by adjusting a current of a unit current cell to adjust a slope of a ramp signal, which will be described in detail with reference to FIG. 3, FIG. 4A to 4C, and FIG. 5 to FIG. 7.

Figure 3:
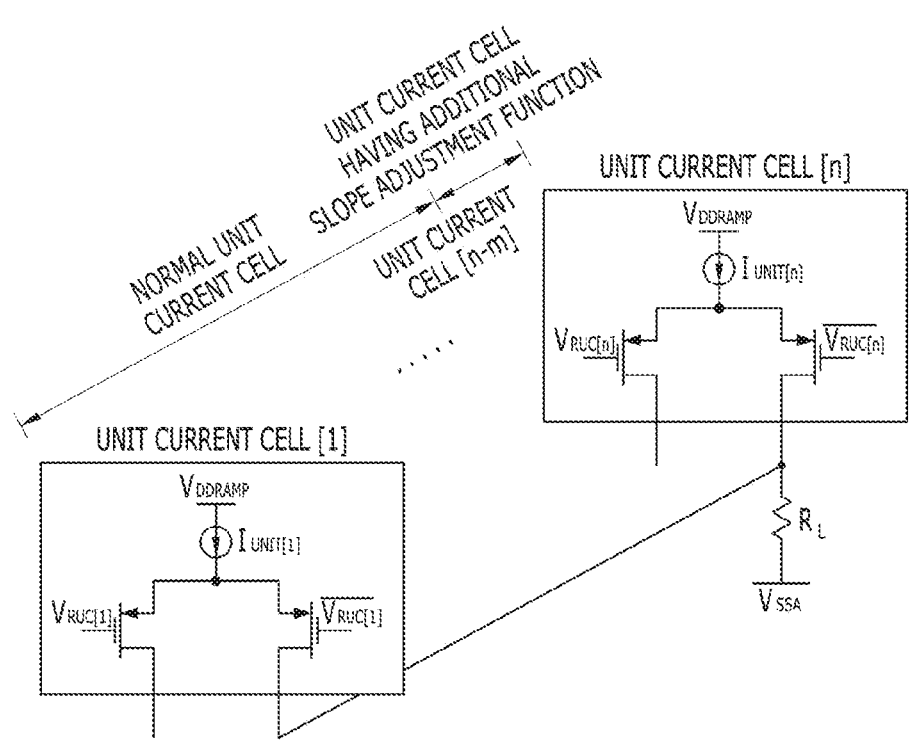
FIG. 3 is a diagram for explaining an example of a unit current cell array structure of a ramp signal generator based on an embodiment of the disclosed technology.

FIG. 3 is a diagram for explaining an example of a unit current cell array structure of a ramp signal generator based on an embodiment of the disclosed technology.

As illustrated in FIG. 3, among unit current cell arrays constituting the ramp signal generator, m (m is a natural number) normal unit current cell arrays corresponding to lower bits of a digital code use substantially the same structure as that of the ramp signal generator illustrated in FIG. 2A and FIG. 2B, and n–m (n is a natural number larger than m) normal unit current cell arrays corresponding to upper bits of the digital code use a unit current cell array having an additional slope adjustment function. Here, "n" denotes the number of all unit current cells corresponding to the number of steps of the ramp signal generator, and is 1024 in the case of a ramp signal having a resolution of 10 bit. In an embodiment of the disclosed technology, an end portion of a ramp signal (a portion corresponding to the upper bits of the code) is adjusted by setting the number (n–m) of the unit current cells having the additional slope adjustment function according to non-linearity requirement and the like. When the ramp signal generator operates, the unit current cells are sequentially selected and driven according to timings of $V_{RUC}[n]$ and $V_{RUCB}[n]$.

Figure 4A:
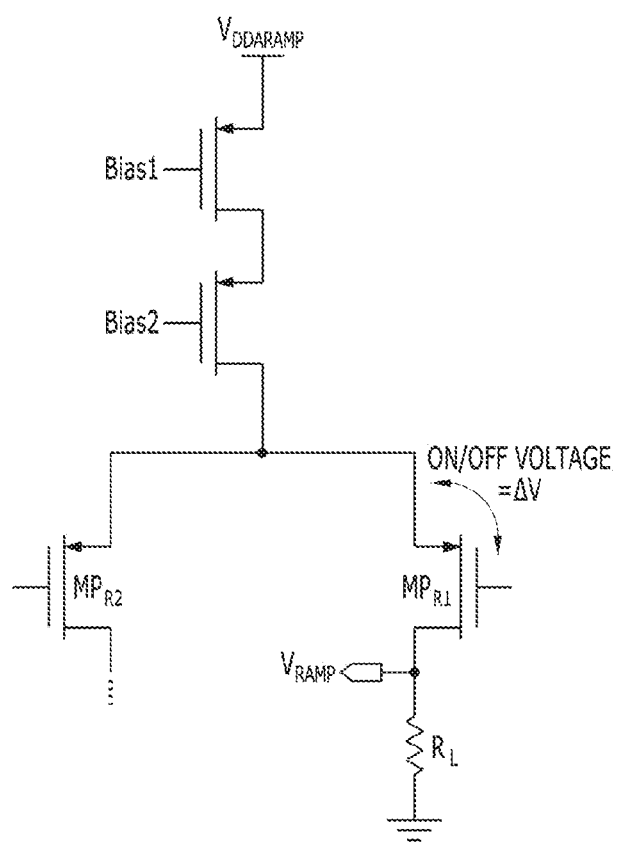
FIG. 4A to FIG. 4C are diagrams for explaining an operation of a unit current cell of a ramp signal generator implemented based on an embodiment of the disclosed technology.
Figure 4B:
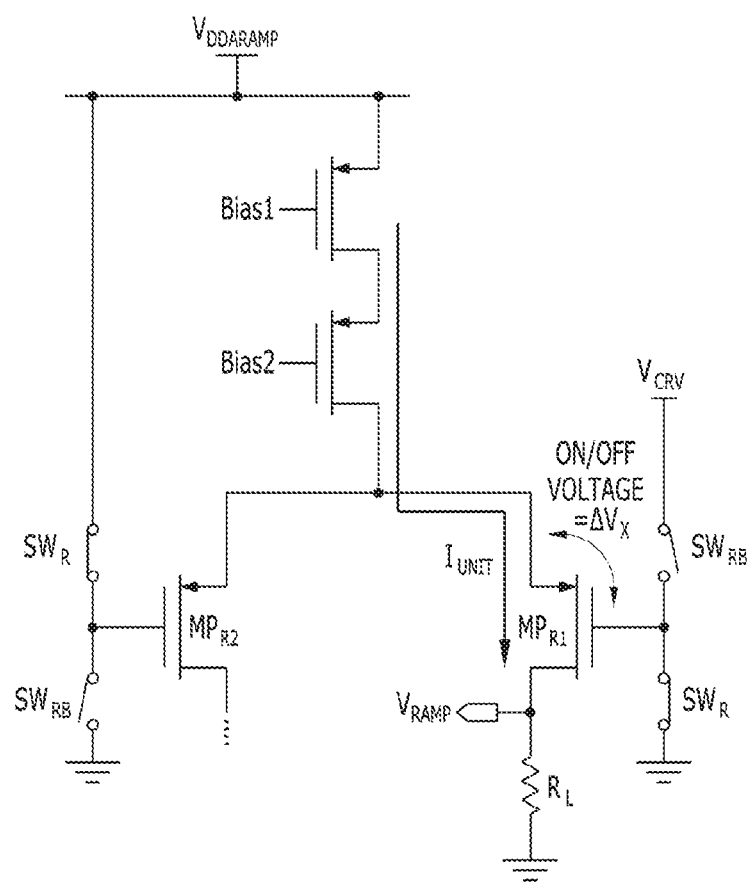
Figure 4C:
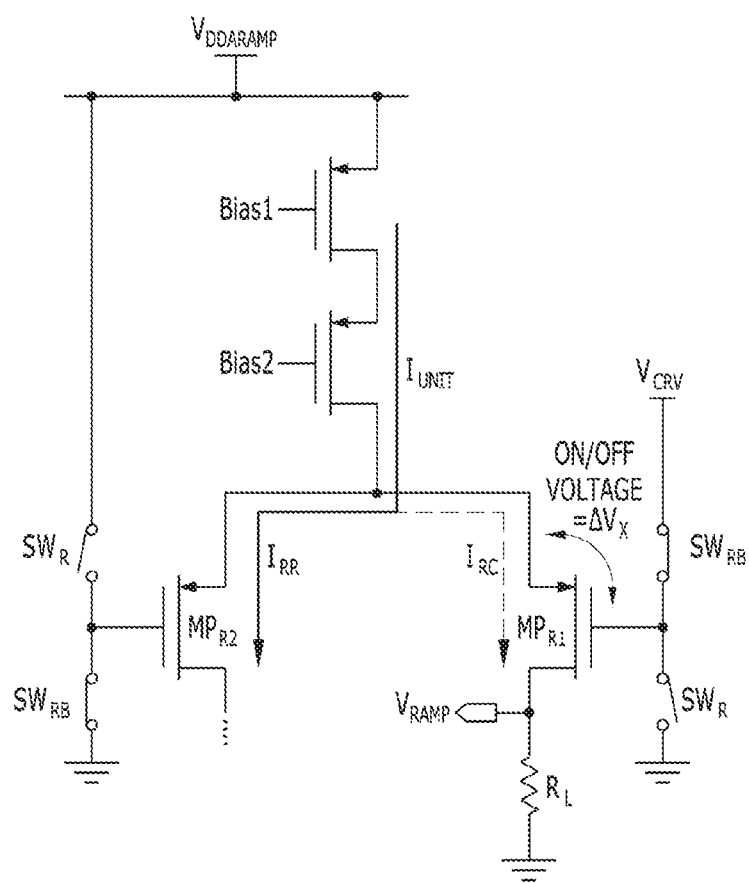
Figure 5:
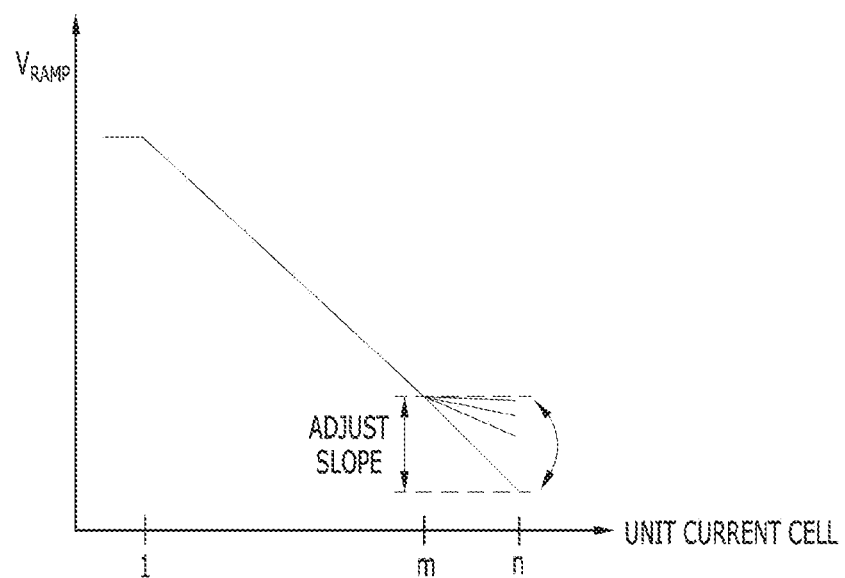
FIG. 5 is a diagram illustrating an example of a ramp voltage based on an embodiment of the disclosed technology.

FIG. 4A to FIG. 4C are diagrams for explaining an operation of a unit current cell of the ramp signal generator implemented based on an embodiment of the disclosed technology, and FIG. 5 is a diagram illustrating an example of a ramp voltage based on an embodiment of the disclosed technology.

As illustrated in FIG. 4A, when the unit current cells of the unit current cell array constituting the ramp signal generator are turned on/off, an ON/OFF voltage ΔV is applied to PMOS transistors $MP_{R1}$ and $MP_{R2}$ that control a current. The ON/OFF voltage ΔV is expressed by Equation 3 below.

$$\Delta V = \text{supply voltage} - \text{ground voltage} \quad \text{(Equation 3)}$$

Unlike the ramp signal generator illustrated in FIG. 4A, which uses the ON/OFF voltage ΔV, the ramp signal generator illustrated in FIG. 4B and FIG. 4C does not use the ON/OFF voltage ΔV in order to turn on/off the unit current cell when a ramp voltage is generated. Instead, the ramp signal generator illustrated in FIG. 4B and FIG. 4C uses an ON/OFF voltage ΔVx based on a controllable reference voltage $V_{CRV}$ to adjust a current of the unit current cell, thereby controlling a step size of the ramp voltage generated when the unit current cell is driven. The ON/OFF voltage ΔVx is expressed by Equation 4 below.

$$\Delta V = V_{CRV} - \text{ground voltage} \quad \text{(Equation 4)}$$

In Equation 4 above, the $V_{CRV}$ denotes the controllable reference voltage.

When a ramp signal has a negative slope, Up to the $m^{th}$ unit current cell, the PMOS transistors $MP_{R1}$ sequentially (one by one) allow the current to flow to the PMOS transistors $MP_{R2}$, thereby generating a ramp voltage in the form described in FIG. 2A and FIG. 2B. In other words, the PMOS transistors $MP_{R1}$ are sequentially turned off one by one up to the $m^{th}$ unit current cell, the PMOS transistors $MP_{R2}$ are sequentially turned on one by one, and the currents flow through the PMOS transistors $MP_{R2}$, so that the ramp voltage is generated as expressed by Equation 2 above.

As described in FIG. 3, from the $(n-m)^{th}$ unit current cell, the unit current cell has the additional slope adjustment function, and the amount of $I_{UNIT}$ is adjusted to the amount of $I_{RC}$ as illustrated in FIG. 4B and FIG. 4C. In a case where the total current is defined as $I_{UNIT}(=I_{RC}+I_{RR})$, when the switch $SW_{RB}$ is switched from "off" and "on" and the switch $SW_R$ is switched from "on" to "off" (the switch $SW_{RB}$ and the switch $SW_R$ are provided between the controllable reference voltage $V_{CRV}$ and the ground voltage to control the gate voltages of the PMOS transistor $MP_{R1}$ and the PMOS transistor $MP_{R2}$), the $I_{RC}$ flows through the PMOS transistor $MP_{R1}$ and the $I_{RR}$ flows through the PMOS transistor $MP_{R2}$. By so doing, a ramp voltage as expressed by Equation 5 below is generated as illustrated in FIG. 5. Here, it is possible to adjust the slope of the ramp voltage by $(I_{T(N-M)} - I_{RC}) * R_L$.

$$V_{RAMP} = ((I_{TM} - I_{T-OFF}) + (I_{T(N-M)} - I_{RC})) * R_L \quad \text{(Equation 5)}$$

In Equation 5 above, where the total amount of current flowing through the ramp resistor RL includes "$I_{TM}$" and "$I_{T(N-M)}$," the "$I_{TM}$" denotes the total sum of currents of m unit current cells generated without the additional slope adjustment function, and the "$I_{T(N-M)}$" denotes the total sum of currents of (n–m) unit current cells having the additional slope adjustment function. The "$I_{RC}$" denotes the amount of remaining currents that continue to flow through the PMOS transistor $MP_{R1}$ even after part of the current that has been flowing through the PMOS transistor $MP_{R1}$ flows through the PMOS transistor $MP_{R2}$ after the switch $SW_{RB}$ is switched from "off" to "on" and the switch $SW_R$ is switched from "on" to "off." In other words, the "$I_{RC}$" denotes the amount of currents adjusted through the slope adjustment function.

As apparent from FIG. 5, when the slope adjustment function is added to the unit current cells from the $m^{th}$ unit current cell to the $n^{th}$ unit current cell, it is possible to precisely adjust the slope of the ramp signal according to the image resolution of a digital-to-analog converter (DAC). In an embodiment of the disclosed technology, unlike the ramp signal generator of FIG. 2A and FIG. 2B, the (n–m) unit current cells are partially on when they are driven to precisely adjust the amount of current flowing through the (n–m) unit current cells by using the digital-to-analog converter (DAC). When the unit current cells are partially on, the slope of the ramp signal decreases compared to when the unit current cells are fully on.

Figure 6:
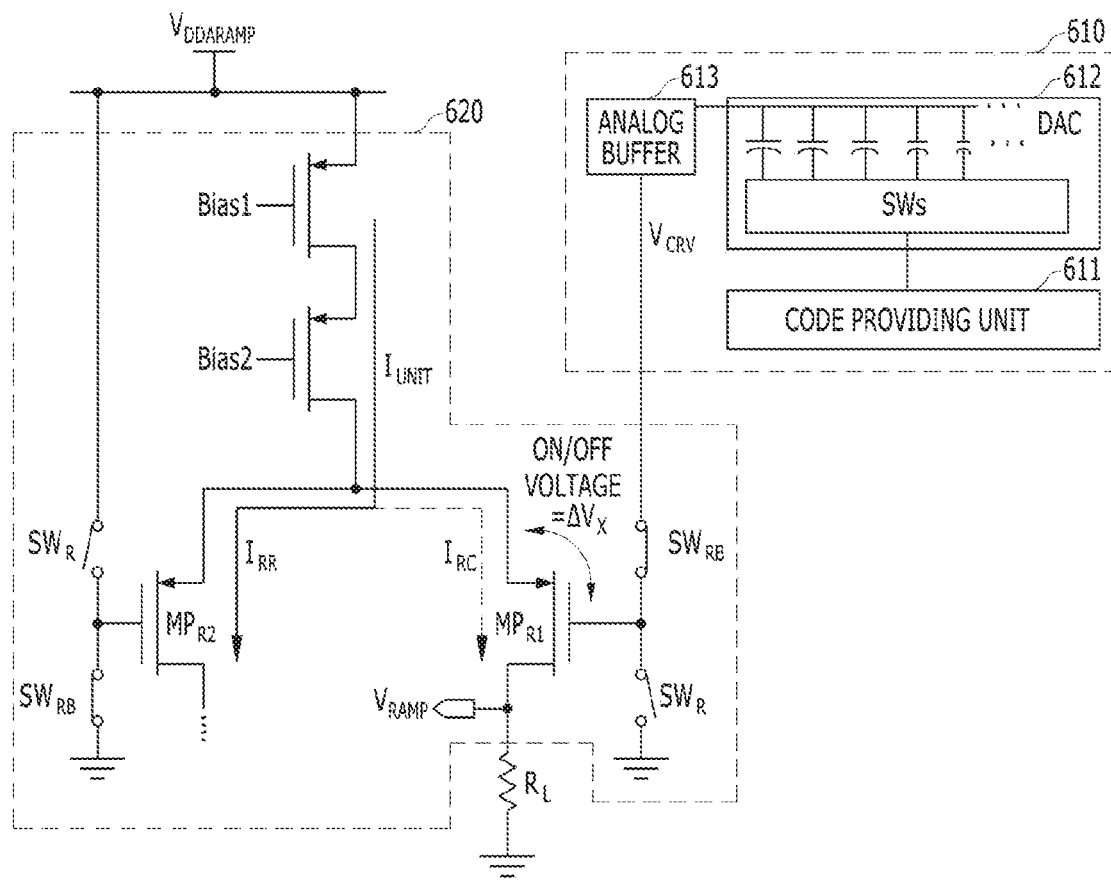
FIG. 6 is a configuration diagram of an example of a ramp signal generator implemented based on an embodiment of the disclosed technology.
Figure 7:
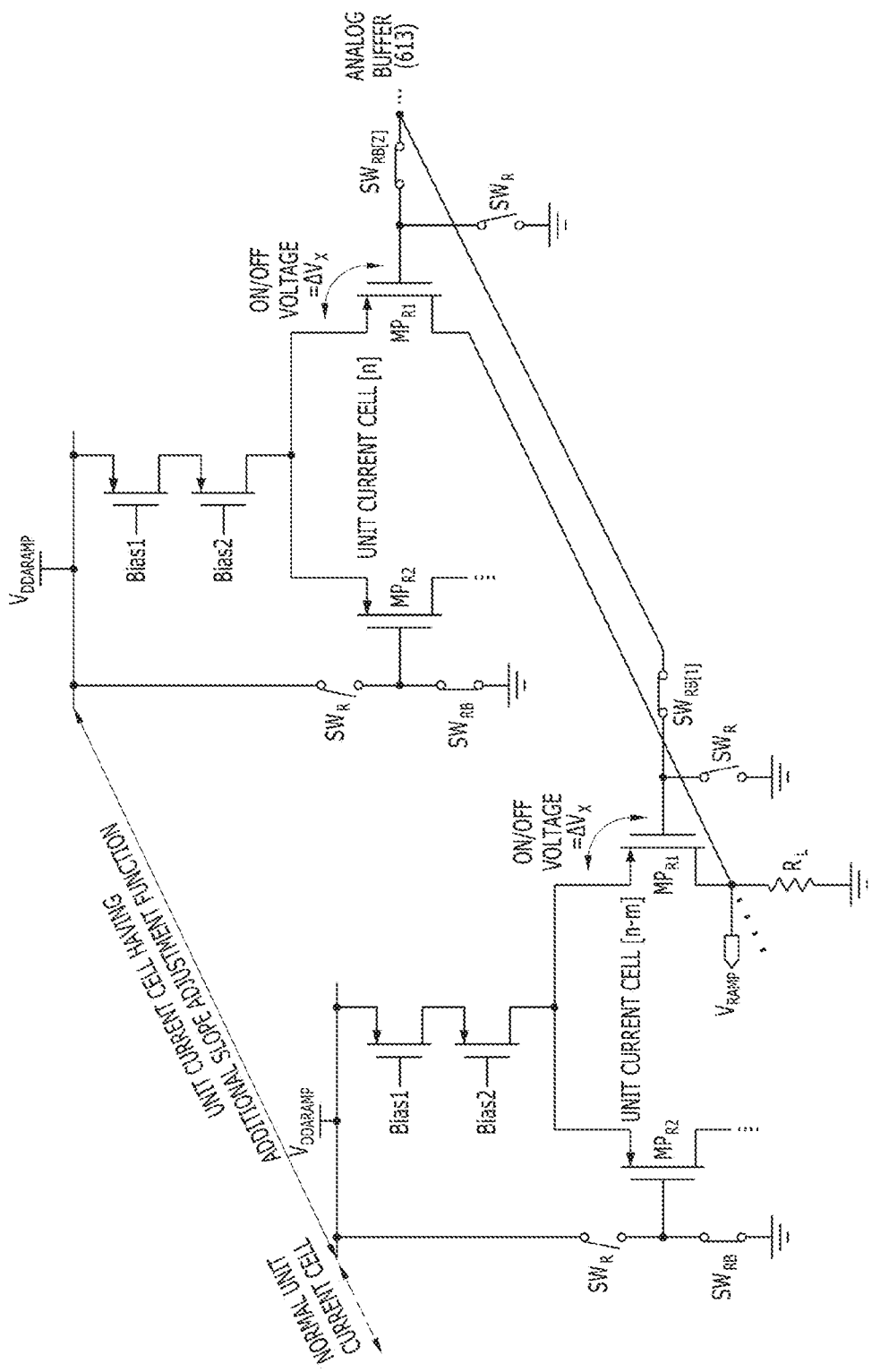
FIG. 7 is a diagram illustrating another example ramp signal generator that globally applies an ON/OFF voltage based on an embodiment of the disclosed technology.

FIG. 6 is a configuration diagram of an example of a ramp signal generator implemented based on an embodiment of the disclosed technology, and FIG. 7 is a diagram illustrating another example ramp signal generator that globally applies an ON/OFF voltage based on an embodiment of the disclosed technology.

As illustrated in FIG. 6, the ramp signal generator implemented based on an embodiment of the disclosed technology includes a slope control block (slope control circuit) 610 and at least one unit current cell 620. Here, the slope control block 610 generates a controllable analog reference voltage $V_{CRV}$ according to a digital setting code value, and the unit current cell 620 adjusts the slope of the ramp signal according to the controllable analog reference voltage $V_{CRV}$ generated by the slope control block 610.

The slope control block 610 includes a code providing unit (code providing circuit) 611 for providing the setting code value and a controllable reference voltage generation unit (controllable reference voltage generation circuit) 612 for generating the controllable reference voltage $V_{CRV}$ according to the setting code value of the code providing unit 611.

The slope control block 610 may further include an analog buffer 613 for supplying the at least one unit current cell 620 with the controllable reference voltage $V_{CRV}$ generated by the controllable reference voltage generation unit 612. When the analog buffer 613 is further provided, the ramp signal generator may be implemented without being largely affected by limitations on the performance of the controllable reference voltage generation unit 612. The analog buffer 613 may be implemented using a simple source follower circuit.

The code providing unit 611 may be implemented by a memory such as a register for receiving the setting code value from an external image signal processor (ISP), storing the setting code value, and providing the setting code value to the controllable reference voltage generation unit 612.

In an example implementation, once the setting code value is set, that setting code value may be continuously used. In another example implementation, a new setting code value is set when a ramp signal is generated. For example, at the time of generation of a ramp signal, the external ISP may input the setting code value of the controllable reference voltage generation unit 612 to the code providing unit 611 of each row.

The controllable reference voltage generation unit 612 may be implemented using a digital-to-analog converter (DAC). The digital-to-analog converter (DAC) may be implemented using a basic structure of a resistive digital-to-analog converter (DAC) including a resistor array or a capacitive digital-to-analog converter (DAC) including a capacitor array.

The at least one unit current cell 620 is not fully turned on/off when a ramp signal (a ramp voltage) corresponding to upper bits of the code is generated. Thus the ON/OFF voltage level of the at least one unit current cell 620 is adjusted according to the controllable reference voltage $V_{CRV}$ of the slope control block 610, and a current flowing through a unit current cell is adjusted, so that it is possible to adjust a slope of the ramp signal.

The slope control blocks 610 may be implemented such that the slope control blocks 610 respectively corresponding to $(n-m)^{th}$ unit current cells cooperate with one another. In another example implementation, one slope control block 610 may be shared by the $(n-m)^{th}$ unit current cells as illustrated in FIG. 7.

Figure 8:
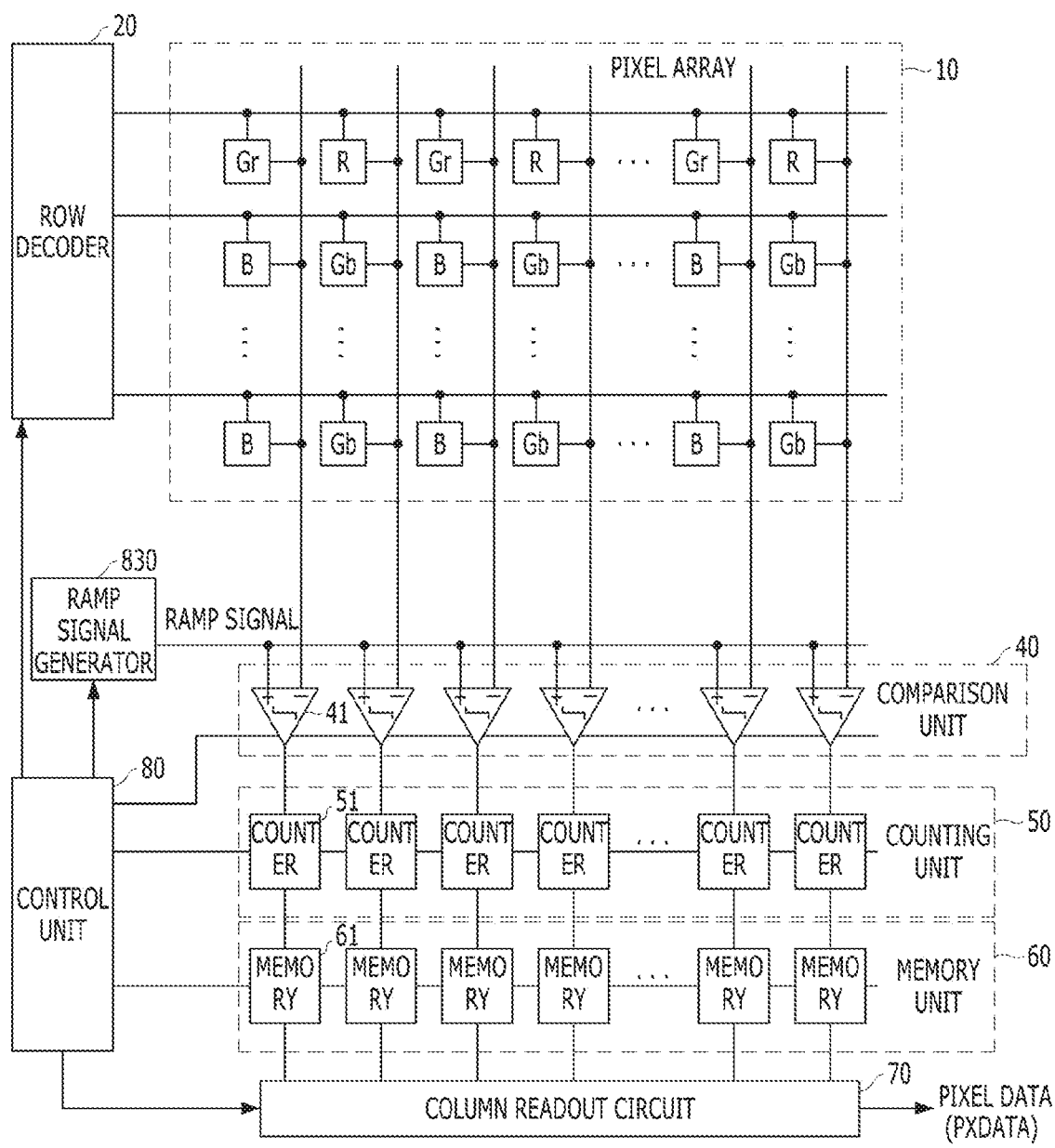
FIG. 8 is a configuration diagram of an example of a CMOS image sensor implemented based on an embodiment of the disclosed technology.

FIG. 8 is a configuration diagram of an example of a CMOS image sensor implemented based on an embodiment of the disclosed technology.

As illustrated in FIG. 8, the CMOS image sensor based on an embodiment of the disclosed technology includes a pixel array 10 for outputting a pixel signal corresponding to incident light, a row decoder 20, a ramp signal generator 830, a comparison unit 40, a counting unit 50, a memory unit 60, a control unit 80, and a column readout circuit 70. The row decoder 20 selects pixels in the pixel array 10 according to row lines and controls operations of the pixels under the control of the control unit 80. The ramp signal generator 830 generates a ramp signal under the control of the control unit 80. The comparison unit 40 compares a value of the ramp signal applied from the ramp signal generator 830 implemented based on various embodiments of the disclosed technology and the value of each pixel signal outputted from the pixel array 10 with each other according to instructions provided by the control unit 80. The counting unit 50 counts clock signals of the control unit 80 according to each output signal of the comparison unit 40. The memory unit 60 stores counting information of the counting unit 50 according to instructions provided by the control unit 80. The control unit 80 controls the operations of the row decoder 20, the ramp signal generator 830 implemented based on various embodiments of the disclosed technology, the comparison unit 40, the counting unit 50, the memory unit 60, and the column readout circuit 70. The column readout circuit 70 sequentially outputs data of the memory unit 60 as pixel data PXDATA according to instructions provided by the control unit 80. The ramp signal generator 830 based on an embodiment of the disclosed technology may be implemented like the ramp signal generator described with reference to FIG. 3, FIG. 4A to 4C, and FIG. 5 to FIG. 7.

In an embodiment of the disclosed technology, a ramp signal generator includes a unit current cell including a current path that allows an electrical current constituting a ramp signal to flow from a ramp supply voltage terminal to a ramp resistor, and a slope control circuit coupled to the analog switch device and configured to receive a digital setting code value and generate a controllable analog reference voltage in response to the digital setting code to apply the controllable analog reference voltage to the analog switch device to control a slope of a ramp signal. Here, the current path including an analog switch device coupled between the ramp supply voltage terminal and the ramp resistor. The unit current cell adjusts the slope of the ramp signal by adjusting a channel current flowing through the analog switch device based on the controllable analog reference voltage, which is adjustable in response to the digital setting code value. The slope control circuit includes a digital-to-analog converter (DAC) that converts the digital setting code value to the controllable analog reference voltage.

Although various embodiments and specific examples have been described, various changes and modifications may be made based on what is described and illustrated.

What is claimed is:

1. A device including a ramp signal generator which comprises:
    a slope control circuit configured to generate a controllable analog reference voltage according to a digital setting code value to control a slope of a ramp signal; and
    at least one unit current cell configured to adjust the slope of the ramp signal by adjusting a current flowing through the at least one unit current cell according to the controllable analog reference voltage generated by the slope control circuit,
    wherein the slope control circuit comprises:
    a code providing circuit configured to provide the digital setting code value,
    wherein the code providing circuit comprises:
    a memory configured to receive the digital setting code value from an external image signal processor (ISP), store the digital setting code value, and provide the digital setting code value to the controllable reference voltage generation circuit.

2. The device of claim 1, wherein the slope control circuit further comprises:
    a controllable reference voltage generation circuit configured to generate the controllable analog reference voltage according to the digital setting code value provided by the code providing circuit.

3. The device of claim 2, wherein the code providing circuit further comprises:
a buffer configured to apply to the at least one unit current cell the controllable analog reference voltage generated by the controllable reference voltage generation circuit.

4. The device of claim 3, wherein the buffer includes a source follower circuit.

5. The device of claim 2, wherein the controllable reference voltage generation circuit includes a digital-to-analog converter (DAC).

6. The device of claim 1, wherein a level of an ON/OFF voltage of the at least one unit current cell is adjusted according to the controllable analog reference voltage generated by the slope control circuit.

7. The device of claim 1, wherein the ramp signal generator adjusts the slope of the ramp signal by adjusting a current flowing through the at least one unit current cell.

8. A device including a CMOS image sensor which comprises:
a pixel array configured to include an array of photosensing pixels in rows and columns to output a pixel signal corresponding to incident light;
a row decoder configured to select and control pixels in the pixel array according to row lines coupled to rows of photosensing pixels;
a ramp signal generator configured to adjust a slope of a ramp signal by adjusting a channel current flowing through an analog switch device based on an analog voltage that is adjustable in response to a digital code;
a comparison circuit configured to compare the ramp signal applied from the ramp signal generator with each pixel signal of the pixel array;
a counting circuit configured to count a number of clock pulses according to each output signal of the comparison circuit;
a memory circuit configured to store counting information of the counting circuit including the number of clock pulses provided by the counting unit;
a control circuit configured to control operations of the row decoder, the ramp signal generator, the comparison circuit, the counting circuit, and the memory circuit; and
a column readout circuit configured to output data stored in the memory circuit according to instructions provided by the control circuit,
wherein the ramp signal generator comprises:
a slope control circuit configured to generate a controllable analog reference voltage according to a digital setting code value to adjust the slope of the ramp signal,
wherein the slope control circuit comprises:
a code providing circuit configured to provide the digital setting code value,
wherein the code providing circuit comprises:
a memory configured to receive the digital setting code value from an external image signal processor (ISP), store the digital setting code value, and provide the digital setting code value to the controllable reference voltage generation circuit.

9. The device of claim 8, wherein the ramp signal generator further comprises:
at least one unit current cell configured to adjust the slope of the ramp signal according to the controllable analog reference voltage generated by the slope control circuit.

10. The device of claim 9, wherein the slope control circuit further comprises:
a controllable reference voltage generation circuit configured to generate the controllable analog reference voltage according to the digital setting code value provided by the code providing circuit.

11. The device of claim 10, wherein the code providing circuit further comprises:
a buffer configured to apply to the at least one unit current cell the controllable reference voltage of the controllable reference voltage generation circuit.

12. The device of claim 11, wherein the buffer include a source follower circuit.

13. The device of claim 10, wherein the controllable reference voltage generation circuit includes a digital-to-analog converter (DAC).

14. The device of claim 9, wherein a level of an ON/OFF voltage of the at least one unit current cell is adjusted according to the controllable analog reference voltage generated by the slope control circuit.

15. The device of claim 9, wherein the ramp signal generator adjusts the slope of the ramp signal by adjusting a current flowing through the at least one unit current cell.

16. A device including a ramp signal generator which comprises:
a unit current cell including a current path that allows an electrical current constituting a ramp signal to flow from a ramp supply voltage terminal to a ramp resistor, the current path including an analog switch device coupled between the ramp supply voltage terminal and the ramp resistor; and
a slope control circuit coupled to the analog switch device and configured to receive a digital setting code value and generate a controllable analog reference voltage in response to the digital setting code value to apply the controllable analog reference voltage to the analog switch device to control a slope of a ramp signal,
wherein the unit current cell adjusts the slope of the ramp signal by adjusting a channel current flowing through the analog switch device based on the controllable analog reference voltage, which is adjustable in response to the digital setting code value,
wherein the slope control circuit comprises:
a code providing circuit configured to provide the digital setting code value,
wherein the code providing circuit comprises:
a memory configured to receive the digital setting code value from an external image signal processor (ISP), store the digital setting code value, and provide the digital setting code value to the controllable reference voltage generation circuit.

17. The device of claim 16, wherein the slope control circuit further includes a digital-to-analog converter (DAC) that converts the digital setting code value to the controllable analog reference voltage.

* * * * *